United States Patent [19]

Bridges et al.

[11] 4,340,770

[45] Jul. 20, 1982

[54] ENHANCEMENT OF THE MAGNETIC PERMEABILITY IN GLASSY METAL SHIELDING

[75] Inventors: Jack E. Bridges, Park Ridge; Marvin J. Frazier, Roselle, both of Ill.

[73] Assignee: Allied Corporation, Morris Township, Morris County, N.J.

[21] Appl. No.: 67,600

[22] Filed: Sep. 21, 1979

[51] Int. Cl.³ ............................................. H05K 9/00
[52] U.S. Cl. ............................. 174/35 MS; 148/108; 307/91; 336/84 R
[58] Field of Search ....................... 174/35 MS, 35 R; 336/84 M, 84 R; 307/91; 148/108

[56] References Cited

U.S. PATENT DOCUMENTS

| | | | |
|---|---|---|---|
| 2,026,060 | 12/1935 | Pratt | 336/75 X |
| 2,351,004 | 6/1944 | Camras | 360/119 X |
| 2,864,963 | 12/1958 | Dornstreich et al. | 336/84 R X |
| 4,030,892 | 6/1977 | Mendelsohn et al. | 174/35 MS X |
| 4,189,618 | 2/1980 | Bretts et al. | 174/35 MS |

OTHER PUBLICATIONS

Gyorgy in *Metallic Glasses*; American Society for Metals, pp. 275–303; 1976.
Spooner *Effect of a Superposed Alternating Field on Apparent Magnetic Permeability and Hysteresis Loss* Phys. Rev. vol. 25, pp. 527–540; 1925.
Evenden et al, *Seismic Prospecting Instruments* vol. 2, pp. 68–73; 1971.
Cohen *Enhancement of Ferromagnetic Shielding Against Low Frequency Magnetic Fields* Applied Physics Letters, vol. 10, pp. 67–69; Feb. 1, 1967.
Albach et al, *Ein durch vorerregte Dynamobleche magnetisch abgeschirmer Messraum* Z. f. angew. Physik, vol. 9, pp. 111–115; 1957.
Eldridge *The Mechanism of AC-Biased Magnetic Recording* IRE Transactions on Audio; Sep.–Oct. 1961; pp. 155–158.
Camras *Current Problems in Magnetic Recording* Proceedings of the IRE vol. 50, pp. 751–760; May, 1962.

Primary Examiner—B. A. Reynolds
Assistant Examiner—D. A. Tone
Attorney, Agent, or Firm—James Riesenfeld; Horst M. Kasper; Gerhard H. Fuchs

[57] ABSTRACT

An apparatus for shielding a time dependent magnetic field comprises a magnetic metallic glass element in which a magnetic biasing field is generated having higher frequency components than the major components of the time dependent magnetic field.

5 Claims, 4 Drawing Figures

ENHANCEMENT OF THE MAGNETIC PERMEABILITY IN GLASSY METAL SHIELDING

FIELD OF THE INVENTION

The present invention relates to increasing the magnetic induction of time dependent electromagnetic fields in metallic glasses.

BACKGROUND OF THE INVENTION

Many applications exist for high induction magnetic materials.

Desirable magnetic properties of glassy metal alloys for applications such as magnetic shields have been disclosed by E. M. Gyorgy in Metallic Glasses, p. 275, American Society for Metals, Metals Park, 1976.

The effect of a superposed alternating field on apparent magnetic permeability and hysteresis loss of magnetic materials was considered in T. Spooner, Phys. Rev. 25, 527 (1925). Spooner investigated one percent silicon steel punchings and found that for small induction values the apparent permeability was increased by a d-c magnetizing force.

B. S. Evenden, D. R. Stone and N. A. Anstey in Seismic Prospecting Instruments, Vol. 2, disclose employing a d-c magnetic field or a high frequency bias field for improving the recording characteristics of tape heads.

David Cohen in Applied Physics Letters, 10, 67 (1967) discloses enhancement of ferromagnetic shielding against low-frequency magnetic fields by impression of an alternating magnetic field of a constant amplitude.

W. Albach and G. A. Voss in Z. f. Agnew Physik, 9, 112 (1957) disclose increasing the magnetic shielding of dynamo sheet metal by pre-excitation with alternating magnetic fields.

Donald F. Eldridge in IRE Transactions on Audio, September–October 1961, page 155, discussed the mechanism of A-C biased magnetic recording.

H. P. Pratt in U.S. Pat. No. 2,026,060 discloses placing a magnetic shell in a magnetic field to enhance its electromagnetic shielding capacity.

Marvin Camras in Proceedings of the IRE 50, 751 (1962) discusses some of the explanations and theories with regards to the playback process in magnetic recording including a-c biasing.

Marvin Camras in U.S. Pat. No. 2,351,004 discloses a system for linearly impressing magnetic variations on a completely demagnetized steel wire.

SUMMARY OF THE INVENTION

In accordance with the present invention, an apparatus for shielding a time dependent magnetic field comprises a magnetic element utilizing metallic glass. A means for generating in said element a magnetic biasing field having higher frequency components then the frequency of the major components of the time dependent magnetic field is employed. Such an apparatus is also useful as a high permeability sensor.

DETAILED DESCRIPTION OF THE INVENTION AND OF THE PREFERRED EMBODIMENTS

Figure 1:
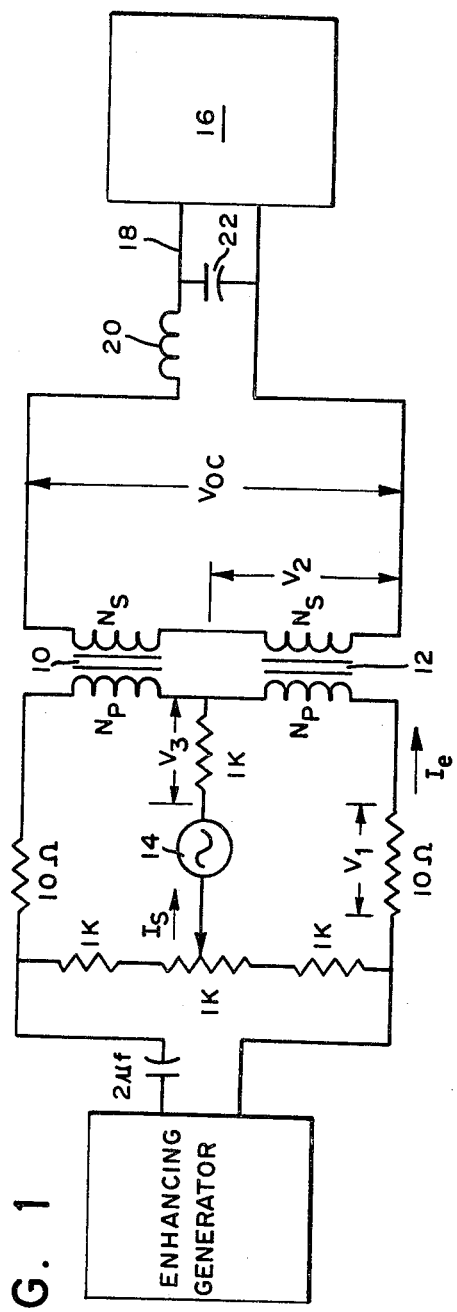
FIG. 1 is a schematic circuit diagram of a transformer test set up.

A magnetic induction apparatus provides a medium for increasing and focusing the magnetic induction in a certain spatial area. Focusing as employed in the context of the present invention means concentrating the magnetic induction density in a certain area.

Such magnetic induction apparatus includes devices such as magnetic shields, relay parts, magnetic amplifiers, transformers, magnetostrictive vibrators, magnetic membranes, magnetic tape heads, inductive coils and audio speakers.

A biasing field is applied to a metallic glass for enhancing the magnetic permeability of the metallic glass with respect to time dependent signals.

The time dependent signals can be sinusoidal or pulse signals. The term time dependent signal is intended to include wave forms of interest which may or may not contain desired message data. For example such time dependent signal could be audio speech wave form or 60 Hz interference. For the purposes of this invention such time dependent signal has a frequency spectrum range which is considered as being of interest.

The purpose of the time dependent signal can vary. It may be an extrinsic signal which is to be shielded, a signal which is to be concentrated by the metallic glass or a signal which is to be picked up by the metallic glass.

The biasing field has a frequency greater than the major component of the time dependent signal. In general the frequency of the biasing signal is at least about two times the considered frequency of the time dependent signal and preferably from about five to one hundred times the considered frequency of the time dependent signal. The advantage of a higher biasing frequency relative to the time dependent signal is better prevention of aliasing which means better prevention of extraneous signals introduced by the permeability enhancement process. The biasing frequency can be as high as $(10^6)$ Hz.

The intensity of the biasing field should be at least 1 Oe. The induction generated by the biasing field should preferably be about the magnitude of the remanent induction. The preferred vector orientation of the biasing magnetic field with respect to the metallic glass surfaces is about parallel to the plane of the metallic glass surface. Vector orientation can also be perpendicular to the flat surfaces for very low biasing frequencies where eddy current losses are not critical.

Optionally, the biasing field may be modulated at a frequency intermediate between the considered frequency of the time dependent signal to about the frequency of the biasing field. The waveform and the amplitude of the biasing field are not critical. Preferably, the amplitude of the biasing field has a waveform with a relatively long dwell time near the coercive field strength $H_c$. Such dwell time could be more than half of the total time involved. Near the coercive field strength $H_c$ means between about 0.5 $H_c$ and 2 $H_c$.

Optionally, the vector orientation of the biasing field may rotate with a frequency of from about 1 Hz to about $10^5$ Hz. The biasing field should extend over the area employed as a magnetic inductor. Preferably the vector orientation rotation is parallel to the plane of magnetic induction element.

The biasing field can be generated by conventional magnetic induction apparatus. The biasing field can be transmitted by any medium, however media with high permeability are preferred.

The metallic glass employed in the present invention consists of at least one metal alloy that is primarily glassy and has a maximum permeability of at least about 20,000 and a coercivity of less than about 0.08 Oe. Preferred are metallic glasses having a maximum permeability of at least about 100,000 and a coercivity of less than about 0.04 Oe.

The metal alloy comprises about 75 to 87 atom percent of at least one metal selected from the group consisting of iron and cobalt, up to about three-fourths of which may be replaced by nickel and the balance at least one metalloid selected from the group consisting of boron, carbon and phosphorous, up to about one third of which may be replaced by an element selected from the group consisting of silicon and aluminum plus incidental impurities.

Preferably, up to about 10 atom percent of said at least one metal is replaced by at least one element selected from the group consisting of chromium, molybdenum, copper, manganese, vanadium, niobium, tantalum and tungsten and it is more preferred to have the at least one element selected from the group consisting of chromium and molybdenum.

The magnetic glass can be annealed at a temperature of above the Curie temperature of the metallic glass and at least about 15° C. below the crystallization temperature for a period of time of up to about 3 hours. The annealing may include a magnetic field applied to the shield during cooling through the Curie temperature. The applied magnetic field can have a magnetic field strength of about 1 to 10 Oe or at least about 0.1 times the coercive field strength. The biasing field can be amplitude modulated with a frequency intermediate between the biasing frequency and the frequency of the major components of the time dependent field.

The use of simple field enhanced permeability for the as-cast metallic glass results in permeabilities that are quite comparable to the permeabilities resulting from the annealing process applied to high quality conventional shielding materials. Special field enhancing techniques will result in effective permeabilities, for the metallic glasses that are considerably higher than available for other shielding materials.

Multiple or nested shields can also be used to increase the performance of a shield for a given weight of shielding material. In the design of nested shields, an important parameter is the distance separating the shields relative to the shield diameter. For small relative separations, the shielding effectiveness approaches that due to the total thickness of material used. However, for large relative separation between shields, the shielding effectiveness of the nested shield approaches the product of the individual shielding factors.

Large sized shields tend to require greater relative shield separations than do smaller diameter shields. For a given diameter, material thickness and separation between nested shields, the resulting nested shielding effectiveness can range from the sum of the individual shield factors to the product of the individual shield factors, depending on the geometry of the shield and the thickness of the shield materials. The higher the permeability, the more the nested shielding effectiveness tends to the product of the individual shielding factors.

Optimum enhancement waveforms exist for the metallic glass materials where the amplitude of the applied magnetic field intensity waveform was adjusted so that the maximum time was spent near $H_c$. This means that the amplitude of magnetic field intensity is roughly equal to the maximum value of $H_c$ for the metallic glass material.

Aliasing can be prevented by applying enhancement waveforms whose frequencies are above the Nyquist rate. This requires that the base band circuits filter out all frequencies above the base band. Another method to prevent aliasing is by shaping the waveform of the field enhancing drive such as by having the time variations of the enhanced permeabilities of constant amplitude except for short duration transition periods such as in a flat top waveform.

EXAMPLE 1

Permeability Enhancement

Highly significant improvements in low-field effective permeability can be obtained for the metallic glasses by application of the field enhanced permeability technique. As an example, the relation between the signal field and induction at 100 Hz under normal and enhanced permeability conditions for a metallic glass composition $Fe_{40}Ni_{40}P_{14}B_6$ shows for toroidal transformer cores of 3.81 cm diameter made of 10 grams of 2 mil × 70 mil metallic glass ribbon that for the low-field range, where the permeability becomes asymptotic to a constant value, the enhanced permeability exceeds the normal permeability by a factor greater than two orders of magnitude.

Table I shows a comparison of the normal and enhanced permeability for low signal fields which were obtained for the various metallic glass transformer samples. The permeabilities shown are approximately the initial permeabilities, since the values shown were for 100 Hz signal fields in the range of 1–2 m Oe. Shown also in the table is the ratio of the enhanced to normal initial permeability. It can be seen that the permeability enhancement technique provides a significant benefit for most of the compositions tested. The lowest enhancement ratio was for the $Fe_{40}Ni_{40}P_{14}B_6$ ribbon which had been annealed. However, the enhanced permeability for the annealed material was only slightly greater than for the non-annealed $Fe_{40}Ni_{40}P_{14}B_6$. The most significant improvement obtained by the enhancing procedures was for the $Fe_{40}Ni_{40}P_{14}B_6$ metallic glass as cast in 2.2×73 mil ribbons.

The improvements obtained by permeability enhancement are much more significant for the metallic glasses than for more conventional materials.

The data shown in Table I were obtained with an enhancing field which was sinusoidal at a frequency of 10 kHz. The enhancing field level was adjusted for each material tested to provide the maximum enhancement for low signal field levels.

TABLE I

NORMAL AND ENHANCED INITIAL PERMEABILITY OF METALLIC GLASS CORE TOROIDAL TRANSFORMERS

| Composition | Ribbon Dimensions | Initial Permeability Normal | Initial Permeability Enhanced | Ratio |
|---|---|---|---|---|
| $Fe_{40}Ni_{40}P_{14}B_6$ | 2.3 × 73 mil | 300 | $5.1 \times 10^4$ | 170 |
| $Fe_{40}Ni_{40}P_{14}B_6$ | 2.3 × 73 mil (adjacent ribbons) | 278 | $1.75 \times 10^4$ | 63 |

TABLE I-continued
NORMAL AND ENHANCED INITIAL PERMEABILITY OF METALLIC GLASS CORE TOROIDAL TRANSFORMERS

| Composition | Ribbon Dimensions | Initial Permeability | | Ratio |
| --- | --- | --- | --- | --- |
| | | Normal | Enhanced | |
| | insulated) | | | |
| $Fe_{40}Ni_{40}P_{14}B_6$ | 1.6 × 484 mil | 360 | $1.6 \times 10^4$ | 44 |
| $Fe_{40}Ni_{40}P_{14}B_6$ Annealed | 2.3 × 73 mil | $1.9 \times 10^3$ | $6.3 \times 10^4$ | 33 |
| $Fe_{80}B_{10}Si_{10}$ | 1.5 × 505 mil | 430 | $2.2 \times 10^4$ | 51 |
| $Fe_{80}Co_{10}Ni_{10}$ | 1.7 × 71 mil | 360 | $2.1 \times 10^4$ | 58 |

EXAMPLE 2

Transformer Testing

Tests have been conducted to determine the normal and field enhanced permeability of several different metallic glass compositions. These tests have included both the variation of signal and enhancing frequencies and amplitude, as well as an assessment of the enhancing field losses for one of the metallic glass samples.

Test Setup

The typical test arrangement is shown in FIG. 1. The test uses two transformers, 10 and 12, as identical as possible, with cores of the material to be tested. The transformers were wound on a toroidal core of the magnetic material. Most transformer toroids had a core diameter of 3.81 cm, and employed 10 grams of magnetic material. Most transformers had 150 turn primaries and either 15 or 150 turn secondaries.

As shown in FIG. 1, the two transformers were connected with series aiding primaries and opposing secondaries. The enhancing field in the cores was produced by the current, $I_e$, which flowed through the series aiding primaries. Due to the oppositely connected secondaries, the enhancing induction canceled across the series connected secondaries. Thus, $V_{oc}$ contained only small levels due to the enhancing induction in the cores.

The signal frequency excitation was derived from the audio oscillator 14, which fed current, $I_s$, to the primary junction between the two transformer primaries. This current was adjusted to split equally between the two primaries. Due to the opposing connection of the secondaries, the signal induction in the two cores added in producing the output voltage $V_{oc}$ across the two secondaries.

The open circuit output voltage $V_{oc}$ at the signal frequency was measured with wave analyzer 16 (HP 302A). The LC network 18 ahead of the wave analyzer comprised an induction 20 of 100 millihenry and a capacitor 22 of 2 $\mu F$ and further reduced the enhancing frequency voltage at the wave analyzer input while producing negligible loading on the network.

The enhancing frequency current was determined by measuring $V_1$ with a second wave analyzer. The enhancing frequency induction could be determined by measuring $V_2$, with no signal frequency applied. Enhancing frequency losses were determined by measuring $V_1$ and $V_2$ with an HP vector voltmeter, which provides the amplitudes as well as the phase bretween the two voltages.

The signal magnetization was determined by measuring the voltage $V_3$ which is directly proportional to $I_s$.

Magnetization and Induction Relations

Standard relations were used to determine the magnetic field, induction and permeability of the cores. The cgs system of units was employed. The expressions, in terms of the voltages and currents measured, are:

$$H_{sig} = \frac{0.4 \, I_s N_p}{2d} = \frac{0.4 \, V_3 N_p}{2000 d} \quad (A.1)$$

where
 d=toroidal core diameter—cm
 $N_p$=number of primary turns
 $V_3$ and $I_s$ identified above and in FIG. 1.

$$B_{sig} = \frac{10^8 \pi V_{oc} d}{4 \pi f_s W N_s} \quad (A.2)$$

where
 $f_s$=signal frequency—Hz
 W=weight of magnetic core—grams
 $\rho$=magnetic material density—g/cm$^3$
 $N_s$=number of secondary turns
 $V_{oc}$=signal open circuit voltage identified in FIG. A-1.

$$\mu_{eff} = \frac{B_s}{H_s} = \frac{10^9 d\rho}{8 f_s N_p N_s W} \quad (A.3)$$

Test Results

The principal test data obtained was the effective signal induction $B_s$ as a function of signal magnetization $H_s$ with and without enhancement. The enhancing frequency was 10 kHz, and the signal frequency was 100 Hz. Other data, in which the signal and enhancing frequency were varied, was obtained in a similar manner and is presented in Example 3.

The test results were plotted as curves relating effective signal induction to magnetization with and without enhancement. The procedure followed in obtaining the data included the following sequence.

1. With no enhancing signal, measure $V_3$ and $V_{oc}$ for the lowest signal level to be used.
2. Adjust the level of the enhancing signal for a peak in $V_{oc}$. The enhancing generator setting remained constant for all enhanced data points.
3. Attenuate enhancing generator to obtain $V_{oc}$ for next higher signal level.
4. Bring enhancing generator back to the level established in 2. and record $V_{oc}$.
5. Repeat Steps 3 and 4 for successive levels of signal current.

This has shown that the permeability enhancing procedure provides a significant increase in the effective permeability for the metallic glass magnetic materials that have been tested. Of significance is the fact that this enhancing procedure results in permeabilities for the as-cast metallic glasses that are quite comparable to the permeabilities obtained by annealing the nickel-rich ferromagnetic alloys that are typically used for high quality magnetic shields. The high-nickel soft magnetic materials used for high performance low-field magnetic shielding are referenced by various trade names, such as Hipernom, Mumetal, Moly-Permalloy, etc. Various manufacturers provide typical values of low-field permeability for these annealed materials. Typical 60 Hz permeability values for low fields (a few millioersteds) that are cited, range from 25,000 to 85,000.

Comparing the enhanced permeability $Fe_{40}Ni_{40}P_{14}B_6$ metallic glass over the low signal field range with typical values for Mumetal, over the range of interest, from 10 Gauss to 5000 Gauss, the enhanced effective permeability of the $Fe_{40}Ni_{40}B_{14}B_6$ metallic glass compares quite favorably with the Mumetal.

Mumetal and the other nickel-rich ferromagnetic alloys require carefully controlled annealing to produce high permeability for use in shields for low-level magnetic fields. The high permeability produced by this procedure is not long-term stable for many typically encountered environments, must be performed after the shielding assembly has been fabricated and is expensive. The metallic glasses, can provide comparable permeability as the result of an enhancing high frequency field. When applied to the metallic glass materials, this field enhanced permeability does not require special annealing of the magnetic material and is not expected to degrade due to environmental factors such as vibration or shock.

EXAMPLE 3

The permeability enhancement of metallic glasses illustrated in Example 2, employed only a simple constant-level high frequency sinusoidal enhancing field. While such an enhancing field raised the permeability of the as-cast metallic glasses to the range of annealed competitive shielding materials, additional improvement in permeability were possible by optimization of the enhancing field waveform.

Further improvements were possible if the enhancing field flux density in the material was a sawtooth or triangular waveform, that is, if the derivative of the enhancing flux time waveform was a square wave. Comparison of this waveform with the sinusoidal enhancing field showed that the additional improvement in effective permeability was approximately a factor of two. This waveform may, however, minimize intermodulation components.

EXAMPLE 4

This example involves the use of an enhancing field with two orthogonal vector components that are in 90° phase quadrature. Such an enhancing field insures that the domains are in continuous motion. Thus, the signal magnetizing force required to cause a given flux change are minimal, viz, high effective signal permeability.

EXAMPLE 5

This example involved the use of a modulated high frequency enhancing field. The basic concept was to use the modulation to cause an amplitude variation in the enhancing field. The modulated enhancing field constituted a sampling function which might cause the material to "lock-up" in signal field dependent remanent states at the sampling function rate. The results indicated a noticeable improvement in the effective permeability over the sinusoidal enhancing field case.

Transformer test results were obtained for $Fe_{40}Ni_{40}P_{14}B_6$ metallic glass 2.3×73 mil ribbon 10 gram cores. The effective 100 Hz signal induction versus the signal field were observed for three conditions: (a) no enhancing field, (b) sinusoidal enhancing field (10 kHz) and (c) modulated enhancing field (10 kHz carrier-2.5 kHz modulation). The enhancing field level was a fixed value for these curves. It was found that with the modulated enhancing field an initial effective permeability of 300,000 is obtained. This effective permeability is essentially constant over the low signal field range of interest, and is substantially above that obtained for a simple sine enhancing field.

EXAMPLE 6

Shielding

Shielding tests were performed on seven cylindrical shields, to demonstrate the effectiveness of the permeability enhancement technique. The tests have established that significant shielding improvements were obtained by use of the field enhanced permeability technique, particularly in the important low-field region.

The shielding performance of magnetic materials is generally assessed by use of cylindrical tubes of the material. The shielding measurements are normally made with the magneticc field transverse to the cylinder axis. The shielding effectiveness of the cylinder is expressed as the ratio of the external undisturbed field $H_o$ to the field $H_i$ measured at the center of the cylinder, as was shown in Equation (A.4).

Ideally, the cylinder length should be great compared to the diameter in order that end effects not influence the measurement. The cylinders used in this example had a diameter of 2 inches and a length of approximately 8 inches. For this geometry, end effects should be negligible for shielding ratios less than about 300 (50 dB).

The shielding effectiveness S, defined by $$S = H_o/H_i \quad (A.4)$$

where $H_o$ is the magnetic field in the absence of the shield, and $H_i$ is the magnetic field at the center of the shield, was measured with $H_o$ transverse to the cylinder axis. The shielding effectiveness was measured as a function of $H_o$, the field level over the range of about 0.1 Oe to 10 Oe, both with and without an enhancing field.

Test Setup and Procedures

The signal field was produced by two helical solenoids. Each solenoid consisted of 16 turns, with a mean diameter of 60 inches, and a length of about 23 inches. In order to provide a uniform magnetic field over the working volume where the sample was placed, the two helical solenoids were separated by a distance equal to the radius.

A variable auto-transformer was used to drive currents up to 100 amperes through the helical solenoidal coils to provide the desired range of signal fields. The signal field $H_o$ at the test cylinder location was measured by a pre-calibrated magnetic field probe, prior to positioning the test cylinders in place, and used to determine the relationship between $H_o$ and the coil. The shielding effectiveness $S = H_o/H_i$, expressed in dB, was determined as a function of the external signal field level $H_o$, for a single layer of 2.3×73 mil ribbon $Fe_{40}Ni_{40}P_{14}B_6$ metallic glass wound on the 2 inch diameter form. The normal material, without enhancement, was compared with the shielding effectiveness of the $Fe_{40}Ni_{40}P_{14}B_6$ cylindrical shield with the permeability enhancing field applied. The enhancing field was sinusoidal at 10 kHz, which was produced by a many turn solenoid which was coaxial to the shielding cylinder. The shielding effectiveness with enhanced permeability is relatively constant with signal field level, up to about 2 Oe. For higher field levels, the enhanced shielding effectiveness decreases and becomes identical to the normal shielding curve for field levels above the break point in the normal curve.

Other cylindrical shields tested with and without field enhanced permeability show similar trends to those observed with $Fe_{40}Ni_{40}P_{14}B_6$. Field enhanced and nonfield enhanced shielding have a peak shielding effectiveness as a function of signal field level. The peak of the enhanced shielding generally occurs at a slightly lower signal field than for the normal material but the peak shielding is greater. For signal field strengths above the peak, the field enhanced and nonfield enhanced values fall nearly together. For fields lower than necessary for peak shielding, the normal shielding values fall continuously as the field is lowered over the range tested. For fields below peak shielding for the enhanced condition, the shielding tends to become asymptotic to a constant value in the range of 5–10 dB less than the peak.

A summary of the cylindrical shielding data obtained is presented in Table 2. The table lists the shielding effectiveness in dB for each shield tested, with and without permeability enhancement. For each case, two values of shielding are presented; that for a field of 0.2 Oe, and the maximum shielding obtained. The field level of 0.2 Oe is a somewhat arbitrary level, but is near the lower field limit used for most of the tests, and provides a reasonable low field comparison between the different materials. As noted above, the normal shielding response generally decreases further for fields below this level, while the enhanced shielding is generally relatively constant below this field level.

Good shielding was obtained with annealed $Fe_{40}Ni_{40}P_{14}B_6$ metallic glass 2.3×73 mil ribbon. This cylinder was annealed after being fabricated. In the as-cast form, the $Fe_{40}Ni_{40}P_{14}B_6$ metallic glass 2.3×73 mil ribbon provided the best shielding, but was only slightly better than the Fe/Co/Ni metallic glass ribbon.

The enhanced shielding of the as-cast $Fe_{40}Ni_{40}P_{14}B_6$ metallic glass was significantly greater than the normal shielding of numerous conventional materials.

TABLE 2

Comparison of Normal And Enhanced Permeability Shielding Effectiveness of 2" Diameter, 8" Long Cylinders

| Metallic Glass Material | Thickness mils | Shielding Effectiveness dB | | | |
|---|---|---|---|---|---|
| | | Normal | | Enhanced | |
| | | at $H_o=$ 0.2 Oe | Maximum | $H_o=$ 0.2 Oe | Maximum |
| $Fe_{40}Ni_{40}P_{14}B_6$ 73 mil ribbon Annealed | 2.3 | 26 | 43 | 54 | 55 |
| $Fe_{40}Ni_{40}P_{14}B_6$ 73 mil ribbon | 2.3 | 20 | 36 | 38 | 42 |
| $Fe_{40}Ni_{40}P_{14}B_6$ 484 mil ribbon | 1.6 | 16 | 20 | 27 | 28 |
| Fe/Co/Ni 71 mil ribbon | 1.7 | 18 | 34 | 35 | 40 |
| $Fe_{80}B_{10}Si_{10}$ 505 mil ribbon | 1.5 | 14 | 22 | 26 | 28.5 |

EXAMPLE 7

Frequency and Power Relations Enhancing Field Level and Losses

The data that has been shown in Examples 1–6 for both transformers and shields was obtained with an enhancing field at a frequency of 10 kHz. For all cases, the level of the enhancing field was adjusted to produce the highest permeability or shielding at a low-level of signal field, and was held constant as the signal field level was varied. For a constant signal field level, the effective signal permeability increases as the enhancing field level increases, until a maximum permeability is obtained. Further increases in enhancing field, above the level necessary for maximum permeability, causes the effective signal permeability to decrease. Thus, for a given enhancing field frequency, there is an optimum field level that is a function of the signal field level but is only weakly dependent on the signal frequency.

The variation in optimum enhancing field level, as a function of signal field level, was observed for a cylindrical shield of $Fe_{40}Ni_{40}P_{14}B_6$ metallic glass. For the important lower level signal fields, the required enhancing field level is relatively constant, and the 3 dB shielding degradation limit does not impose severe tolerance restrictions on the amplitude of the enhancing field.

The enhancing field strength and power loss to maximize the signal effective permeability are important factors. The optimum-level sine wave enhancing field magnitude varies as a function of enhancing field frequency for the 70 mil width ribbon $Fe_{40}Ni_{40}P_{14}B_6$ metallic glass transformer cores tested in this study.

Similarly, the enhancing field power requirement as a function of the enhancing field frequency was observed. For a sine wave the enhancing field was adjusted to optimum level at each frequency for the transformers used. The enhancing field level and power required both increase continuously as the enhancing field frequency is increased for frequencies below about 30–40 kHz.

Another important factor is the variation of the signal effective permeability as a function of the enhancing field frequency. It was found that the effective permeability of a 100 Hz signal depends on the enhancing field frequency.

For low frequency signal shielding, viz, in the range of 100 Hz, an enhancing field around 4–5 kHz is preferred. For practical construction enhancing fields of higher frequency may be more desirable to insure that signals related to the enhancing field are minimized within the shielded space. In the higher frequency range, above about 20 kHz the characteristics vary quite rapidly.

Signal Frequency

The signal effective permeability depending on signal frequency was observed. Transformers used were of annealed 70 mil wide $Fe_{40}Ni_{40}P_{14}B_6$ metallic glass ribbon. In the variation in permeability as a function of signal frequency for constant level signal and enhancing fields the effective permeability decreases as the signal frequency increases. At the signal field level used for this test, the normal permeability was approximately 2000, and independent of signal frequency, for signals between 100 Hz and 10,000 Hz. Thus, some permeability enhancement exists for signals that are higher in frequency than the enhancing frequency, although aliasing must be suppressed by controlling the shape of the waveform of the biasing signal.

The signal effective permeability varies with enhancing field frequency for several different signal frequencies at the same low-field level and the permeability decreases as signal frequency increases across a wide enhancing frequency range. For the signal field level used for these tests, the normal permeability was 2000. Again permeability enhancement was obtained when the signal frequency is greater than the enhancing field frequency.

Although only a single value of enhancing field level will produce the maximum signal permeability or shielding effectiveness, a reasonable tolerance (in the range of ±10%) in the enhancing field level will result in shielding effectiveness within about 3 dB of the maximum. Using the field enhanced permeability technique, the stability of the enhancing field level is in general sufficient for glassy metal alloys, but this is not the case for nickel-iron-cobalt alloys.

The signal effective permeability, required enhancing field level, and power which must be supplied by the enhancing field source, are all a function of the frequency of the enhancing field. The data for $Fe_{40}Ni_{40}P_{14}B_6$ metallic glass show that maximum signal permeability is produced when the enhancing field frequency is in the range of 4–5 kHz. However, the permeability variation are not extreme in the range between 1 kHz and 10 kHz.

The required enhancing field level and losses are both slowly increasing functions of enhancing field frequency up to about 20 kHz. These functions peak at about 40 kHz, above which both the enhancing field magnetization and loss decrease up to 100 kHz, which was the upper frequency tested.

The permeability and shielding enhancement is a function of the signal frequency and the ratio of the signal frequency to enhancing field frequency. Even though the normal unenhanced permeability is a constant with signal frequency over the range tested, the enhanced permeability decreases as the signal frequency increases.

Enhancement can be provided even when the signal frequency is larger than the enhancing frequency. However, the enhancement is not as great as when the signal frequency is less than the enhancing frequency (by a factor of 2 or more).

EXAMPLE 8

High Performance Shields

The shielding performance of four shield configurations are presented to illustrate the range of shielding that is obtainable for "super permeability" metallic glass shields.

Since shielding performance is a function of the size of the shield, size is considered in the example with the shield diameter ranging from ½ inch to 100 inches. Shield material thickness is also important in determining the effectiveness of the shield. For the present example, single layer (0.002 inch thick) and 10 layer metallic glass shields were considered.

For the present example a double nested shield was employed although in an actual design, additional shields could be considered. For the present example, the relative separation between shields was fixed at 10%. For the smaller diameter shields, the shield separation could be reduced without significantly degrading performance, while for the larger shields, additional shielding could be achieved by increasing the shield separation. The expressions used for determining the effectiveness of nested shields are available from A. K. Thomas "Magnetic Shielded Enclosure Design in the DC and VLF Region" IEEE Transactions on Electromagnetic Compatibility Vol EMC-10, No. 1, March 1968.

A permeability for the metallic glass material of $10^6$ has been used for this example. This level of permeability is attainable with the metallic glass materials by use of optimized field enhancement techniques.

The following configurations were investigated.

(a) a single shield of single layer (0.002 inch thickness) metallic glass (b) a double shield (10% relative spacing) each shield of a single layer of metallic glass (c) a single shield of 10 layers of 0.002 inch metallic glass (d) a double shield (10% relative spacing) each shield comprised of 10 layers of metallic glass.

Shielding effectiveness, in dB, was determined as a function of shield diameter (the relations for cylindrical shields were used, with eddy current effects being neglected) for the four example shields. All curves show decreasing shielding effectiveness as the diameter increases.

For large diameters, the performance of a double shield of single layer material and of a single shield of 10 layers of material were the same, while for smaller diameters, the double shield of single layer material provided better shielding. Quite impressive shielding performance is obtained by use of thin shields of "super permeability" metallic glass material.

EXAMPLE 9

Construction of Enhanced Shields

Figure 2:
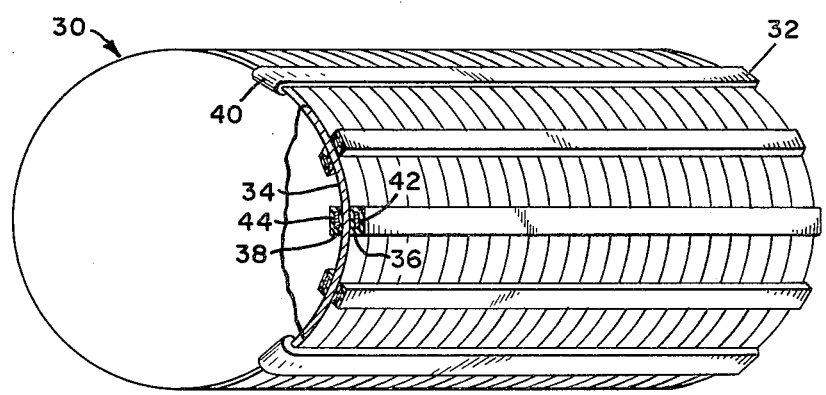
FIG. 2 is a schematic representation, in partial cross section, of a cylindrical magnetic shield.

Referring now to FIG. 2, there is shown the geometry and the form of the shield. The shield 30 has a diameter of 10 cm and a length of 30 cm. The winding 32 comprises a triple laminate of a glassy metal strip 34 sandwiched between two copper conductors 42 and 44 which are shorted at 40. The copper conductors have a thickness of about 0.6 mm. The copper conductors are covered with an insulating coating 36 and 38. The current employed is about 2 amp. For this example, a 10 kHz enhancing field is employed, and the values for the required field level and losses are those measured for $Fe_{40}Ni_{40}P_{14}B_6$ metallic glass ribbon. The majority of the power is dissipated in the current carrying conductors rather than in the magnetic material for relatively thin conductors. Thus, the conducting ribbons are thick in order to minimize the conductor power dissipation. This configuration is practical for smaller shields where the power dissipated in the conductors would be low.

EXAMPLE 10

A similar configuration to Example 9 is used to provide the enhancing field for a shielded cable. If the cable diameter is considered as about ½ inch, the magnetic material is a single layer $Fe_{40}Ni_{40}P_{14}B_6$ metallic glass ribbon, then the magnetic material loss is 34 watts per 100 meter length of shielded cable. To insure low transfer impedance for the cable, the conductor thickness for copper is in the range of 15 mils. The two concentric conducting shells (shorted at the far end of the cable) form a magnetically loaded transmission line.

In order to maintain a relatively constant enhancing field along the length of the shielded cable the shunt capacitance between the two conducting shells is controlled. Separating the two conducting shells by about 25 mils result in an approximate 10% variation in enhancing field from one end of the cable to the other for a 100 meter length. To insure maximum shielding of transverse magnetic fields over the cable length, the enhancing field is controlled to within approximately 10%. Additional separation between the conducting shells permits additional cable length.

Other techniques to minimize the variation in enhancing field along the length of the cable are applied if lengths considerably longer than 100 meters are employed. The use of field enhanced permeability and metallic glass magnetic material for the cable configuration reduces significantly the cable transfer impedance in the power line frequency range.

EXAMPLE 11

Figure 3:
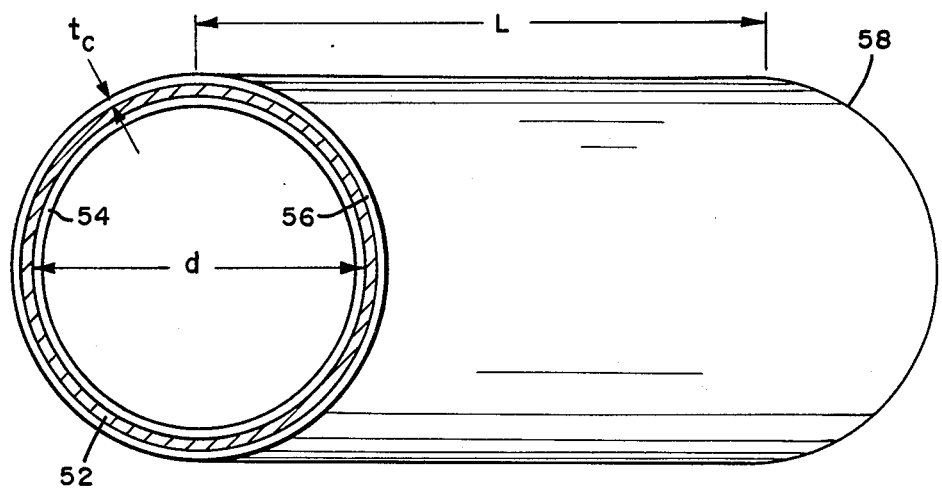
FIG. 3 is a schematic diagram of a concentric conducting shell shield.

Referring now to FIG. 3 there is shown an alternate configuration for supplying the enhancing field for a CRT-like shield. The metallic glass ribbon 52 is wound solenoidally on the cylindrical form. An insulating coating (not shown) is applied to the surfaces of the magnetic material to prevent current conduction through the magnetic ribbon. Thin conductive foil 54 and 56 is then placed on the inside and outside surfaces of the cylindrical shell to form current carrying conductors for producing the enhancing field. The two conductors are joined together on one end 58 of the cylinder, while the power source supplies current to the other end, i.e., a potential is established between the two concentric conducting shells.

The conducting shells are quite thin, yet most of the power is delivered to the magnetic material. The power source requirements are determined by using the characteristics determined for $Fe_{40}Ni_{40}P_{14}B_6$ 2×70 mil metallic glass ribbon at an enhancing frequency of 10 kHz, viz, an rms enhancing field of 0.36 Oe, with a dissipation of 23 m watt/gram.

For the embodiment shown in FIG. 3, with length L of 30 cm, a diameter d of 10 cm and a conductor thickness $T_c$ of more than 1 micron, the magnetic material loss is 0.84 watt, which presents an equivalent of 0.01 ohm resistance to the power source. The thickness of the current carrying conducting shells can be as small as 8 microns and only 10% of the power will be dissipated in these shells. Conducting shell thickness greater than this value can be desirable from a mechanical standpoint or to provide additional shielding at the enhancing frequency and above, to minimize intermodulation and aliasing.

The current requirement from the power source is approximately 9 amps.

EXAMPLE 12

Figure 4:
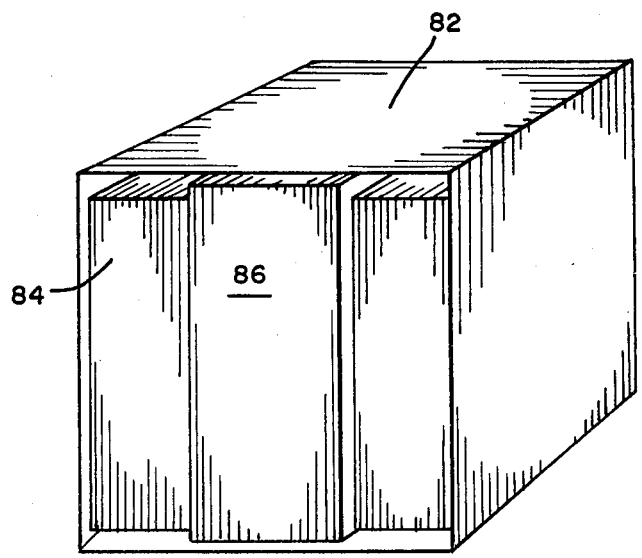
FIG. 4 is a schematic representation of a double box shield.

FIG. 4 illustrates a construction of a large, room-size shield. Two rectangular solenoids 82 and 84 whose axes are orthogonal to each other are shown. The smaller solenoid 84 is inserted within the larger solenoid 82. Physical access is provided by allowing a portion 86 of the smaller solenoid 84 to slide over the remainder as a door.

The shielding characteristic of the metallic glass is complemented by conventional shielding inside the box (not shown). The conventional shielding is needed to prevent aliasing, that is, conversion of signals having frequencies above one-half the Nyquist rate into base band in this case (1 to 1000 Hz). In addition, conventional shielding must provide attenuation in higher frequency regions where the metal glass shielding no longer functions well.

I claim:

1. A method for increasing the magnetic permeability of a magnetic metallic glass shield in a time dependent magnetic field comprising biasing the magnetic metallic glass shield with an electromagnetic field having higher frequency components than the frequency of the major components of the time dependent magnetic field, said biasing field generating induction that is at least about equal to the remanent induction.

2. The method as set forth in claim 1 wherein the biasing field direction rotates in time.

3. The method as set forth in claim 1 wherein the biasing field is modulated by a frequency intermediate between the biasing frequency and the frequency of the major components of the time dependent field.

4. The method as set forth in claim 1 wherein the biasing field has a waveform with a relatively long dwell time near the coercive field strength $H_c$.

5. The method as set forth in claim 1 wherein the direction of the biasing magnetic field is about parallel to the plane of the metallic glass.

* * * * *